| (12) | United States Patent | (10) Patent No.: | US 12,048,972 B2 |
|---|---|---|---|
| | Krause | (45) Date of Patent: | Jul. 30, 2024 |

(54) METHOD AND DEVICE INCLUDING LASER HEATING OF GRIPPER FOR REPAIRING A TEST CONTACT ARRANGEMENT

(71) Applicant: PAC TECH—PACKAGING TECHNOLOGIES GMBH, Nauen (DE)

(72) Inventor: Thorsten Krause, Velten (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 822 days.

(21) Appl. No.: 17/265,961

(22) PCT Filed: Jun. 19, 2019

(86) PCT No.: PCT/EP2019/066167
§ 371 (c)(1),
(2) Date: Feb. 4, 2021

(87) PCT Pub. No.: WO2020/030340
PCT Pub. Date: Feb. 13, 2020

(65) Prior Publication Data
US 2021/0299800 A1 Sep. 30, 2021

(30) Foreign Application Priority Data
Aug. 7, 2018 (DE) .................. 10 2018 119 137.5

(51) Int. Cl.
*B23K 37/047* (2006.01)
*B23K 1/00* (2006.01)
(Continued)

(52) U.S. Cl.
CPC .......... *B23K 37/047* (2013.01); *B23K 1/0016* (2013.01); *B23K 1/0056* (2013.01);
(Continued)

(58) Field of Classification Search
CPC . G01R 3/00; G01R 1/06; G01R 1/067; G01R 1/06711; G01R 1/06727;
(Continued)

(56) References Cited

U.S. PATENT DOCUMENTS 4,696,104 A * 9/1987 Vanzetti ............... B23K 1/0056
228/103
2004/0069763 A1 4/2004 Block et al.
(Continued)

FOREIGN PATENT DOCUMENTS

CN 101368990 A 2/2009
CN 103869270 A 6/2014
(Continued)

OTHER PUBLICATIONS

Japan Patent Office, Notice of Grounds of Rejection, Application No. 2021-506279, May 10, 2022, 11 pages.
(Continued)

*Primary Examiner* — John P. Dulka
(74) *Attorney, Agent, or Firm* — Quarles & Brady LLP

(57) ABSTRACT

A method for repairing a test contact arrangement in which a test contact which is disposed on a test contact carrier by means of solder material and is incorrectly positioned is gripped at a body edge by means of a gripping tool in a gripping contact phase, an absorption surface which is realized on an outer surface of the gripping tool is treated with laser radiation during the gripping contact phase, and the gripping tool performs a movement on at least one axis when the temperature is at the softening point of the solder material, in such a manner that the incorrect position is corrected by means of the movement to bring the test contact into a desired position.

4 Claims, 1 Drawing Sheet

(51) Int. Cl.
  *B23K 1/005* (2006.01)
  *B23K 101/38* (2006.01)
  *G01J 5/00* (2022.01)
  *G01R 3/00* (2006.01)

(52) U.S. Cl.
  CPC .................. *G01J 5/00* (2013.01); *G01R 3/00* (2013.01); *B23K 2101/38* (2018.08)

(58) Field of Classification Search
  CPC .... B23K 26/20; B23K 26/03; B23K 2101/36; B23K 2101/38; B23K 2101/40; B23K 2101/42; B23K 31/125; B23K 37/053
  See application file for complete search history.

(56) References Cited

U.S. PATENT DOCUMENTS

| | | |
|---|---|---|
| 2008/0308536 A1 | 12/2008 | Theppakuttai et al. |
| 2011/0235681 A1 | 9/2011 | Azdasht |
| 2013/0269173 A1* | 10/2013 | Albertson ................ G01R 3/00 29/729 |
| 2016/0346858 A1 | 12/2016 | Shen et al. |
| 2018/0210011 A1 | 7/2018 | Nam et al. |
| 2018/0259554 A1 | 9/2018 | Krause et al. |
| 2019/0011483 A1 | 1/2019 | Krause |

FOREIGN PATENT DOCUMENTS

| | | | |
|---|---|---|---|
| DE | 102008051853 A1 | 4/2010 | |
| DE | 102012002754 A1 * | 8/2013 | ........... B23K 1/0016 |
| DE | 102012002754 A1 | 8/2013 | |
| DE | 102015114129 A1 | 3/2017 | |
| DE | 102016100561 A1 | 7/2017 | |
| JP | 2006071295 A | 3/2006 | |
| JP | 2009022960 A | 2/2009 | |
| JP | 2012000655 A | 1/2012 | |
| JP | 2016096173 A | 5/2016 | |
| JP | 2017506582 A | 3/2017 | |
| KR | 20170128744 A | 11/2017 | |
| WO | 2017026802 A1 | 2/2017 | |
| WO | 2017121542 A1 | 7/2017 | |
| WO | WO-2023186555 A1 * | 10/2023 | ............... G01R 3/00 |

OTHER PUBLICATIONS

PCT International Search Report, PCT/EP2019/066167, Oct. 24, 2019, 6 pages.
PCT English Language Translation of the International Preliminary Report on Patentability, PCT/EP2019/066167, Feb. 18, 2021, 8 pages.
China National Intellectual Property Administration, First Office Action and Search Report, Application No. 201980052254.9, Sep. 23, 2023, 19 pages.
China National Intellectual Property Administration, Search Report, Application No. 201980052254.9, Feb. 19, 2024, 4 pages.

* cited by examiner

METHOD AND DEVICE INCLUDING LASER HEATING OF GRIPPER FOR REPAIRING A TEST CONTACT ARRANGEMENT

This application is a national stage application of International Patent Application No. PCT/EP2019/066167 filed on Jun. 19, 2019, which claims priority to German Patent Application 10 2018 119 137.5, filed on Aug. 7, 2018, which applications are hereby incorporated by reference in their entirety.

The disclosure relates to a method for repairing a test contact arrangement having a plurality of test contacts which are contacted on contact surfaces of a test contact carrier by means of a solder connection, said method comprising gripping a test contact which is incorrectly positioned on the test contact carrier at a body edge by means of a gripping tool in a gripping contact phase, in such a manner that at least one gripping surface which is realized as a heat transfer surface rests against a surface of the test contact conducting heat, said method also comprising treating an absorption surface which is realized on an outer surface of the gripping tool with laser radiation during the gripping contact phase, measuring the temperature reached in the solder material of the solder connection during the radiation treatment, and performing a movement of the gripping tool on at least one axis when the temperature is at the softening point of the solder material, in such a manner that the incorrect position is corrected by means of the movement to bring the test contact into a desired position. Furthermore, the disclosure relates to a device for carrying out said method.

Different embodiments of methods and devices for producing a test contact arrangement are known. For instance, WO 2017/026802 A1 shows a method and a device in which the individual test contacts are grasped by a gripping tool for contacting the test contacts on a test contact carrier and are dipped into a solder material bath with a lower edge which is provided for being contacted with a contact surface of the contact carrier for wetting said lower edge. Subsequently, the test contact is positioned on a contact surface of the test contact carrier with its lower edge by means of the gripping tool and the solder material is treated with laser radiation for producing a solder material connection between the test contact and the test contact carrier.

DE 10 2008 051 853 A1 discloses a method and a device for producing a test contact arrangement, wherein the test contacts are placed onto the solder material which has already been applied to the contact surfaces of the test contact carrier with their lower edges which are provided for being contacted with contact surfaces of the test contact carrier by means of a gripping tool and the test contacts are treated with laser radiation through a radiation channel realized in the gripping tool for fusing the solder material and producing the solder connection between the test contact carrier and the test contacts.

Both known methods and the devices employed with them make it possible to produce test contact arrangements, said test contact arrangements subsequently being subjected to a suitable quality control for ensuring a quality which makes it possible to employ the test contact arrangements without troubles, and corresponding test contact arrangements in which deviations from admissible tolerances have been determined being declared to be rejects.

The quality control, in particular with the aid of optical resources, serves to test if contact tips, which are realized at the upper edges of the test contacts and which serve to establish contact with contact surfaces of a wafer when the test contact arrangement is employed, have the required pitch and are disposed in a common contact plane.

It is the object of the present disclosure to propose a method and a device which make it possible to correct the position of test contacts if said test contacts are incorrectly positioned on the test contact carrier in order to prevent the test contact arrangement from being declared to be reject.

For attaining this object, the method in accordance with the disclosure has the features of claim 1 and the device in accordance with the disclosure has the features of claim 3.

In the method in accordance with the disclosure, a test contact which is incorrectly positioned on the test contact carrier is gripped at a body edge by means of a gripping tool in a gripping contact phase, in such a manner that at least one gripping surface which is realized as a heat transfer surface rests against a surface of the test contact conducting heat, an absorption surface which is realized on an outer surface of the gripping tool being treated with laser radiation during the gripping contact phase, the temperature reached in the solder material of the solder connection being measured during the radiation treatment, and the gripping tool performing a movement on at least one axis when the temperature is at the softening point of the solder material, in such a manner that the incorrect position is corrected by means of the movement to bring the test contact into a desired position.

The method in accordance with the disclosure makes it possible to correct the incorrect position of a test contact by gripping the individual test contact despite the short distance between the test contacts, which results from the required pitch and is even smaller when a test contact is incorrectly positioned. The device, which is necessarily correspondingly compact for this purpose, is in particular rendered possible in that the solder material is indirectly subjected to heat, which is required for softening the solder material connection, via the absorption surface which is in heat-conductive contact with the surface of the test contact and is realized on the outer surface of the gripping tool. Since the solder material is subjected to heat via the gripping contact, there is no need to realize a radiation channel in the gripping tool and to focus the laser radiation onto the solder material of the solder connection, which usually makes it possible to adjust a defined angle of incidence of the radiation, which often cannot be realized due to the short distance of the incorrectly positioned test contact from the adjacent test contact.

In accordance with a preferred variant of the method, for defining the incorrect position, the test contact arrangement is imaged by means of a camera unit and body edge coordinates of the body edge of the test contact are determined from the image by means of an image processing unit, wherein the gripping tool is subsequently placed in the gripping position as a function of the body edge coordinates, in such a manner that a gripping edge of the gripping tool is positioned against the body edge of the test contact, and the gripping tool with its gripping edge is afterwards transferred into a desired position which has been calculated from the image by means of the image processing to correct the incorrect position.

By choosing the body edge of the test contact disposed incorrectly, it is sufficient to determine only two surface coordinates of the test contact in order to define the spatial position of the test contact. These surface coordinates can advantageously be used as spatial coordinates for positioning a gripping edge of the gripping tool so that for positioning the gripping tool in a position from which it is possible to grip the test contact, no loads are transmitted from the gripping tool to the test contact, which would lead to a mechanical load on the test contact arrangement. Instead, the gripping edge of the gripping tool, which is preferably realized as an inner edge, rests against the body edge of the test contact, which is preferably realized as an outer edge, so that no considerable loads are initially transmitted when positioning the gripping tool in the gripping position and a load transmission only takes place when the test contact is transferred into the desired position.

The device which is particularly advantageous for repairing a test contact arrangement comprises a gripping tool having at least one heat-conductive gripping surface which is configured to rest against a surface of the test contact, an absorption surface which is realized on an outer surface of the gripping tool and serves to absorb laser radiation, said absorption surface being disposed in heat-conductive contact with the gripping surface, a laser unit which is aimed at the absorption surface with its optical axis, and a temperature measuring unit for measuring the radiation temperature of the solder material.

The gripping tool preferably has a gripping edge which is realized as an inner edge, for being positioned against a body edge of the test contact which is realized as an outer edge.

If the absorption surface is realized at a material projection realized on the outer surface and forming part of a gripping element of the gripping tool provided with the gripping surface, no heat transfer resistance is realized within the heat transfer path between the absorption surface and the gripping surface as it exists with a transfer between different materials which rest against each other.

The material projection is particularly preferably realized as an absorption web having an absorption flank which is disposed at an obtuse angle with respect to the surface so that it is possible to adjust acute angles of incidence of the laser radiation with respect to a vertical axis of the test contact.

In the following, a preferred variant of the method will be explained in more detail with the help of the drawing using the example of a preferred embodiment of the device employed in this context.

Figure 1:
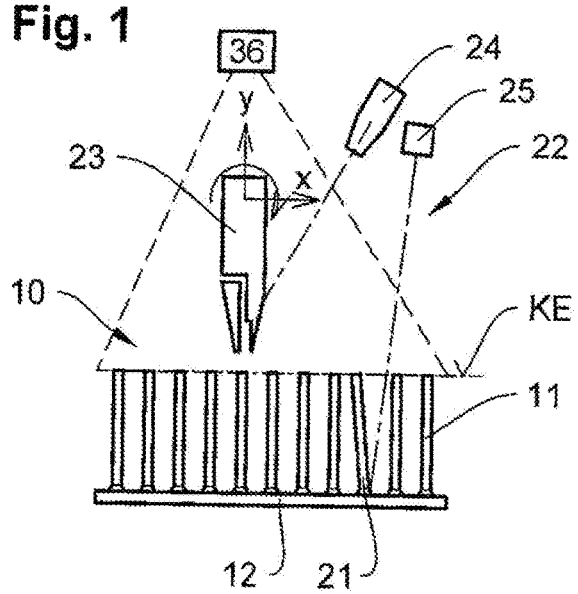
FIG. 1 shows a repairing device positioned above a test contact arrangement.

FIG. 1 shows a test contact arrangement 10 which has a plurality of test contacts 11 which are disposed on a test contact carrier 12. As a combined view of FIG. 1 and FIG. 2 makes clear, the test contacts 11 are contacted with a contact surface 14 of the test contact carrier 12 via a lower edge 13, a solder connection 15 being envisaged for producing the electrically conductive and mechanical contact between the lower edge 13 and the contact surface 14, said solder connection having a solder material 16 which is realized as a metal solder in the present case.

Figure 2:
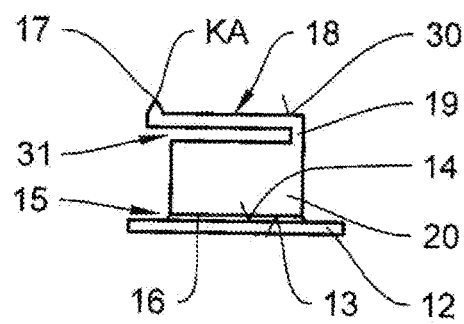
FIG. 2 shows the test contact arrangement illustrated in FIG. 1 in a side view.

As a combined view of FIGS. 1 and 2 furthermore makes clear, the test contacts 11 each have a contact tip 17 which is realized at the free end of a contact cantilever beam 18 which is connected to a test contact base 20 at its cantilever beam base 19, said test contact base being connected to the test contact carrier 12 via its lower edge 13 as already explained above.

For using the test contact arrangement 10 as intended, it is necessary to dispose the contact tips 17 of the individual test contacts 11 in a common contact plane KE and on a common contact axis KA. As FIG. 1 illustrates by way of example, an incorrect position of a test contact 21 within a series of correctly positioned test contacts 11 leads to the contact tip 17 of the incorrectly positioned test contact 21 not being located on a common contact axis KA with the contact tips 17 of the correctly positioned test contacts 11. In deviation from the illustration in FIG. 1, an incorrect position can also lead to the distance between the contact tip 17 of the test contact 21 and the adjacent test contacts 11 not corresponding to the pitch, while the contact tip 17 of the test contact 21 is disposed on a common contact axis KA, so that a correction may only be required in the direction of the X-axis.

For correcting the incorrect position of the test contact 21, a repairing device 22 is located above the test contact arrangement 10, having a laser unit 24 and a temperature measuring unit 25 apart from a gripping tool 23.

Figure 3:
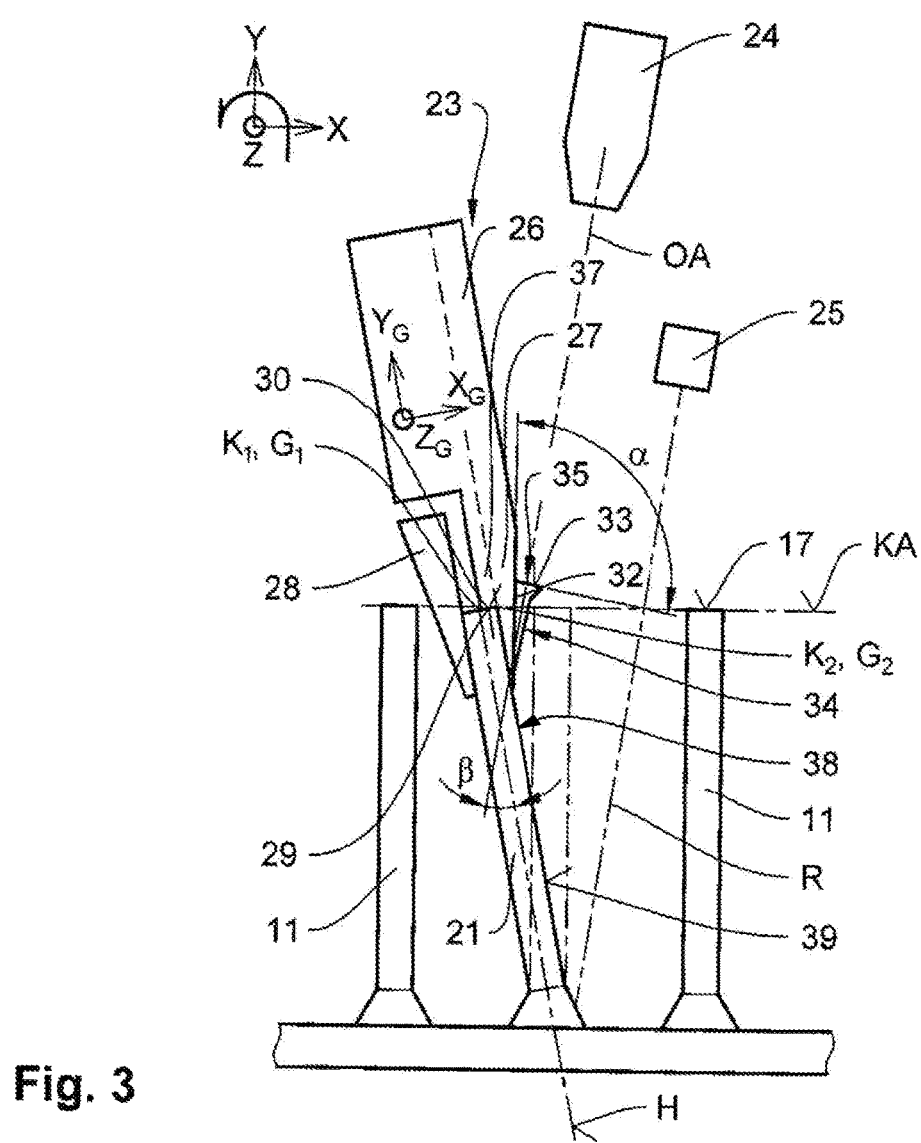
FIG. 3 shows the repairing device illustrated in FIG. 1 while an incorrect position of a test contact of the test contact arrangement is being corrected.

FIG. 3 shows the repairing device 22 in operation during a gripping contact phase in which the gripping tool 23 has grasped the incorrectly positioned test contact 21. As FIG. 3 shows, the gripping tool 23, at a tool body 26, has a first gripping element 27 which is rigidly connected to the tool body 26 and a gripping element 28 which is movable with respect to the gripping element 27. The gripping element 27 has a gripping surface 38 for resting against a surface 39 of the test contact 21. Moreover, a gripping edge 29, which is realized as an inner edge, is realized at the gripping element 27, said gripping edge 29 resting against a body edge 30 of the test contact 21, which is realized as an outer edge in the gripping contact phase, said body edge 30 in the present case being realized by an upper edge of the test contact 21, which is realized by the contact cantilever beam 18 of the test contact 21.

The gripping tool 23, which can in the present case be moved on four axes, namely in the direction of the coordinate axes X, Y and Z delineated in FIG. 3 X and pivotably about the Z-axis, is controlled as a function of the incorrect position of the test contact 21 so that body edge coordinates $K_1$ $(X_{K1}, Y_{K1}, Z_{K1})$ and $K_2$ $(X_{K2}, Y_{K2}, Z_{K2})$ are initially determined from an image of the test contact arrangement 10 which is produced by means of a camera unit 36 (FIG. 1) and from a subsequent image processing, said body edge coordinates clearly defining the spatial position of the body edge 30.

With respect to the coordinate system $X_G$, $Y_G$, $Z_G$ of the gripping tool 23, the gripping edge coordinates $G_1$ and $G_2$ are known. They clearly define the position of the gripping edge 29, which is realized as an inner edge, so that, for spatially disposing the gripping tool 23 in such a manner that the gripping edge 29 of the gripping tool 23 rests against the body edge 30 of the test contact 21 (as illustrated in FIG. 3), the axis control of the gripping tool 23 is effected in such a manner that the gripping edge coordinates $G_1$ and $G_2$ are imaged on the body edge coordinates $K_1$ and $K_2$ or a corresponding coordinate transformation of the gripping edge coordinates is effected, the desired relative arrangement between the gripping tool 23 and the test contact 21 (illustrated in FIG. 3) being produced in this way.

In order to enable a load transmission from the gripping tool 23 onto the test contact 21 starting from this relative arrangement, as a precondition for the position of the test contact 21 being changeable by means of the gripping tool 23, a frictional connection is established between the gripping tool 23 and the test contact 21 in that the movable gripping element 28 is moved with respect to the gripping element 27 in such a manner that the test contact 21 is clamped between the gripping elements 27, 28 in the region of its upper body edge 30 (as illustrated in FIG. 3). For example, the frictional connection can be established in such a manner here that a vacuum acts on the movable gripping element 28, as indicated in FIG. 3 by the dot and dash lines, via a vacuum channel 37 which is realized in the tool body 26 and in the gripping element 27 and through a test contact gap 31 (FIG. 2) which is realized between the contact cantilever beam 18 and the test contact base 20.

For bringing the test contact 21 from the incorrect position illustrated in FIG. 3 into a desired position which is illustrated in dot and dash lines in FIG. 3, radiation is initially applied to an absorption surface 33 which is realized on the outer surface 32 of the gripping element 27, and which is in the present case realized at an absorption web 34 which is realized in one piece with the gripping element 27, in such a manner that the absorption web 34 has an absorption flank 35 for realizing the absorption surface 33. As FIG. 3 shows, the absorption flank 35 is disposed at an obtuse angle α with respect to the surface 32 of the gripping element 27 so that it is possible that the laser unit 24 is disposed in such a way that an optical axis OA of a laser beam path has an acute angle β with respect to a vertical axis H of the test contact 21. Since the absorption flank 35 is treated with radiation, the gripping element 27 is heated and the heat is transferred into the test contact 21 via the contact of the gripping surface 38 realized at the gripping element 27 with the surface 39 of the test contact 21, along with a corresponding heating of the solder material 16 of the solder connection 15.

The absorption flank 35 is treated with radiation until the softening temperature of the solder material 16 has been reached so that the test contact 21 can then be moved into the desired position by means of a corresponding movement of the gripping tool 23, which might be in the direction of multiple axes. In the desired position, the contact tip 17 of the test contact 21 is located on a common contact axis KA with the contact tips 17 of the adjacent test contacts 11, which are correctly positioned.

The temperature measuring unit 25 determines that the softening temperature has been reached and can be realized as an infrared measuring unit, for example, so that the temperature of the solder material 16 can be determined by means of the reflection radiation R of the solder material 16 and the laser unit 24 can be switched off correspondingly after the temperature has been reached and the gripping tool 23 can be moved, in the direction of multiple axes when indicated.

The invention claimed is:

1. A method for repairing a test contact arrangement having a plurality of test contacts which are contacted on contact surfaces of a test contact carrier by means of a solder connection, said method comprising gripping a test contact which is incorrectly positioned on the test contact carrier at a body edge by means of a gripping tool in a gripping contact phase, in such a manner that at least one gripping surface which is realized as a heat transfer surface rests against a surface of the test contact conducting heat, said method also comprising treating an absorption surface which is realized on an outer surface of the gripping tool with laser radiation during the gripping contact phase, measuring the temperature reached in the solder material of the solder connection during the radiation treatment, and performing a movement of the gripping tool on at least one axis when the temperature is at the softening point of the solder material, in such a manner that the incorrect position is corrected by means of the movement to bring the test contact into a desired position, wherein the absorption surface is realized at a material projection realized on the outer surface of the gripping tool and forming part of a gripping element which is provided with the gripping surface, and wherein the material projection is realized as an absorption web having an absorption flank which is disposed at an obtuse angle α with respect to an outer surface of the gripping tool.

2. The method according to claim 1, wherein for defining the incorrect position, the test contact arrangement is imaged by means of a camera unit and body edge coordinates (K1, K2) of the body edge of the test contact are determined from the image by means of an image processing unit, wherein the gripping tool is subsequently placed in a gripping position as a function of the body edge coordinates (K1, K2), in such a manner that a gripping edge of the gripping tool is positioned against the body edge of the test contact, and the gripping tool with its gripping edge is afterwards transferred into a desired position which has been calculated from the image by means of the image processing to correct the incorrect position.

3. A device for repairing a test contact arrangement having a plurality of test contacts which are contacted on contact surfaces of a test contact carrier by means of a solder connection, said device comprising:
   a gripping tool having at least one heat-conductive gripping surface which is configured to rest against a surface of the test contact,
   an absorption surface which is realized on an outer surface of the gripping tool and serves to absorb laser radiation,
   said absorption surface being in heat-conductive contact with the gripping surface,
   a laser unit which is configured to be aimed at the absorption surface with its optical axis OA,
   and a temperature measuring unit for measuring the radiation temperature of a solder material of the solder connection, wherein the absorption surface is realized at a material projection realized on the outer surface of the gripping tool and forming part of a gripping element which is provided with the gripping surface, and wherein the material projection is realized as an absorption web having an absorption flank which is disposed at an obtuse angle α with respect to an outer surface of the gripping tool.

4. The device according to claim 3, wherein the gripping tool has a gripping edge which is realized as an inner edge of the gripping tool, for being positioned against a body edge of the test contact which is realized as an outer edge of the test contact.

* * * * *